(12) United States Patent
Miyoshi

(10) Patent No.: US 7,170,290 B2
(45) Date of Patent: Jan. 30, 2007

(54) SYSTEMS AND METHODS FOR GENERATING A MAGNETIC RESONANCE IMAGE BASED ON A DIFFERENCE BETWEEN A PLURALITY OF SIGNALS

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 90 days.

(21) Appl. No.: 10/993,093

(22) Filed: Nov. 18, 2004

(65) Prior Publication Data
US 2005/0110489 A1    May 26, 2005

(30) Foreign Application Priority Data
Nov. 21, 2003   (JP)   ............... 2003-392523

(51) Int. Cl.
*G01V 3/00* (2006.01)
(52) U.S. Cl. .................................... 324/309
(58) Field of Classification Search .............. None
See application file for complete search history.

(56) References Cited
U.S. PATENT DOCUMENTS

| 4,694,252 A | * | 9/1987 | Riederer et al. ............ 324/309 |
| 4,701,709 A | * | 10/1987 | Yamamoto et al. ......... 324/312 |
| 5,332,968 A | * | 7/1994 | Brown ........................ 324/309 |
| 5,410,250 A | * | 4/1995 | Brown ........................ 324/309 |
| 5,553,618 A | * | 9/1996 | Suzuki et al. ............... 600/411 |
| 6,147,493 A | | 11/2000 | Miyoshi |
| 6,466,016 B1 | | 10/2002 | Miyoshi |
| 6,515,476 B1 | | 2/2003 | Oshio et al. |
| 6,597,172 B2 | | 7/2003 | Miyoshi |
| 6,630,827 B1 | | 10/2003 | Miyoshi et al. |
| 6,664,787 B2 | | 12/2003 | Miyoshi et al. |
| 6,687,527 B1 | * | 2/2004 | Wu et al. .................... 600/410 |
| 6,774,629 B2 | | 8/2004 | Miyoshi |
| 2004/0140803 A1 | * | 7/2004 | Deimling .................... 324/309 |

\* cited by examiner

*Primary Examiner*—Diego Gutierrez
*Assistant Examiner*—Dixomara Vargas
(74) *Attorney, Agent, or Firm*—Carl B Horton, Esq.; Armstrong Teasdale LLP

(57) ABSTRACT

An MRI method comprising preparing at least two pulse sequence databases (PSDs) assumed to have the same echo time (TE) and different repetition times (TR), driving a magnet system of an MRI apparatus in accordance with the two PSDs and collecting MR signals at that time, generating an MR image from MR signals collected in accordance with the PSDs, and weighting a tissue having a specific T1 value with reference to an image corresponding to a found difference between two MR images.

10 Claims, 8 Drawing Sheets

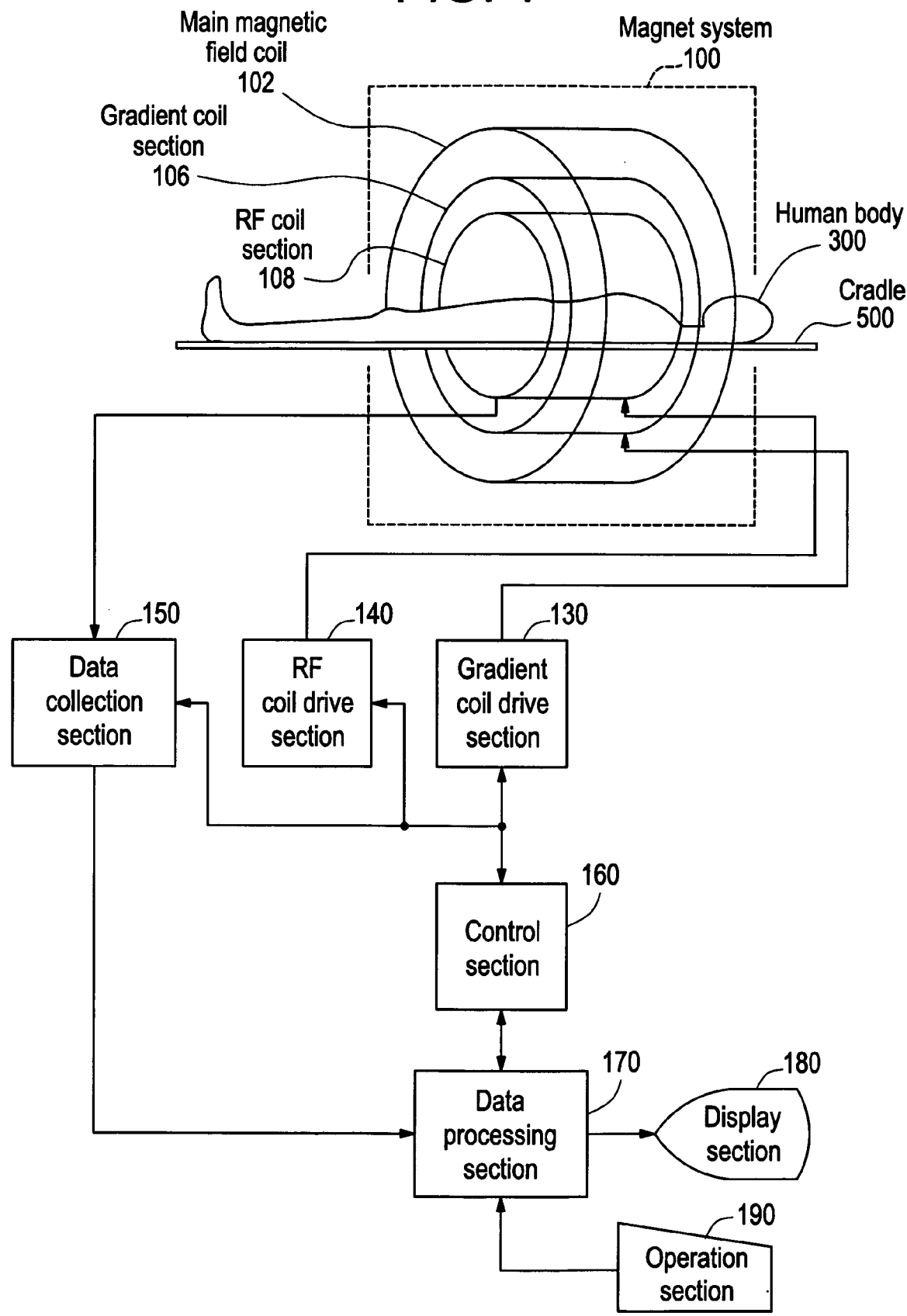

T₁ recovery curve for fat, water, and solid

T₂ attenuation curve for fat, water, and solid

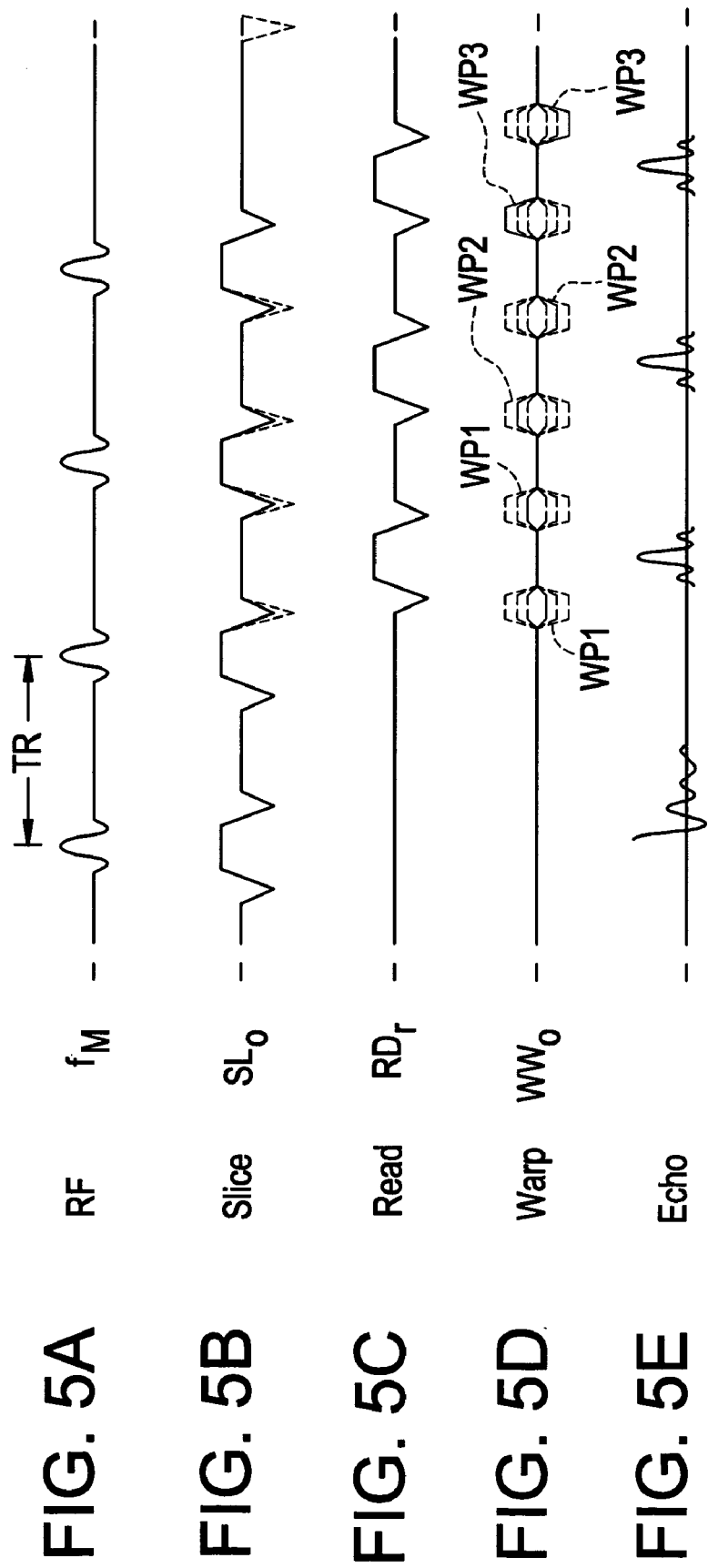

SYSTEMS AND METHODS FOR GENERATING A MAGNETIC RESONANCE IMAGE BASED ON A DIFFERENCE BETWEEN A PLURALITY OF SIGNALS

CROSS REFERENCE TO RELATED APPLICATIONS

This application claims the benefit of Japanese Application No. 2003-392523 filed Nov. 21, 2003.

BACKGROUND OF THE INVENTION

The present invention relates to an magnetic resonance imaging (MRI) method and an MRI apparatus to implement the method which generates images using MR signals detected by using the magnetic resonance (MR) phenomenon. More specifically, the present invention relates to an MRI method and an MRI apparatus to generate an image with useful contrast from images with a plurality of different contrasts.

Clinical examinations using MR images emphasize contrasts of images at a region subject to examination of a subject (human body). The primary contrast determinants are T1, T2, or proton density weighting. The T1 weighting emphasizes tissues having small T1 values. The T2 weighting emphasizes tissues having large T2 values. The proton density weighting emphasizes tissues having high hydrogen densities.

There are trial techniques of emphasizing the contrast of such images. The techniques include: T1 weighting in the spin echo technique (SE); T1 weighting in the fast spin echo technique (FSE); proton density weighting in the FSE; T2 weighting in the gradient echo technique (GRE); and T2/T1 weighting in the steady state free precession (SSFP) mode.

PROBLEMS TO BE SOLVED BY THE INVENTION

However, the above-mentioned techniques face the problem of just acquiring images with contrast dependent on only one piece of information. For example, the prior art cannot satisfy a demand for emphasizing only tissues having large T1 and T2 values. Further, the prior art cannot satisfy another demand for emphasizing only tissues having specific T1 and T2 values.

On the other hand, the computed imaging technique is known as a technique of selecting only specific tissues. The computed imaging technique finds T1 and T2 values through computation from several images such as T1-weighted, T2-weighted, and proton density-weighted (PD) images. However, this technique faces a problem of being incapable of accurate computation if the image information in one pixel contains a plurality of types of tissues. Further, this technique is greatly subject to effects of computational errors due to a noise and is incapable of avoiding effects of computational errors.

SUMMARY OF THE INVENTION

It is therefore an object of the present invention to provide an MRI apparatus and an MRI method capable of generating images with intended, new contrast without adding complicated processes.

According to a first aspect of the present invention, there is provided an MRI method comprising the steps of: preparing at least two pulse sequence databases (PSDs) assumed to have the same echo time (TE) and different repetition times (TR); driving a magnet system of an MRI apparatus in accordance with the two PSDs and collecting MR signals at that time; generating an MR image from MR signals collected in accordance with the PSDs; and weighting a tissue having a specific T1 value with reference to an image corresponding to a found difference between two MR images.

Specifically, the MRI method weights a tissue having a large T1 value with reference to the found difference image. More specifically, the MRI method weights a tissue having large T1 and T2 values with reference to said found difference image.

According to a second aspect of the present invention, there is provided an MRI method comprising the steps of: preparing at least two pulse sequence databases (PSDs) having the same repetition time (TR) and different echo times (TE); driving a magnet system of an MRI apparatus in accordance with the two PSDs and collecting MR signals at that time; generating first and second MR images from MR signals collected in accordance with the PSDs; and finding a difference between two MR images and weighting a tissue having a specific T2 value with reference to an obtained difference image.

According to a third aspect of the present invention, there is provided an MRI method comprising the steps of: preparing the following four pulse sequence databases (PSDs) having different echo times (TE) and repetition times (TR), wherein (1) a fist PSD has echo time TE1 and repetition time TR1; (2) a second PSD has echo time TE1 and repetition time TR2; (3) a third PSD has echo time TE2 and repetition time TR1; and (4) a fourth PSD has echo time TE2 and repetition time TR2, where first echo time TE1<second echo time TE2 and first repetition time TR1<second repetition time TR2; driving a magnet system of an MRI apparatus in accordance with the four PSDs and collecting MR signals at that time; generating first through fourth MR images from MR signals collected in accordance with the PSDs; and finding a difference between (third image−fourth image)−(first image−second image) and weighting a tissue having specific T1 and T2 values with reference to an obtained difference image.

Preferably, a calculation to find the difference between images uses multiplication of an erasing coefficient for removing a specific tissue from one image.

According to a fourth aspect of the present invention, there is provided an MRI apparatus, namely, an apparatus to implement the MRI method according to the first aspect of the present invention.

The MRI apparatus comprises: drive means for driving a magnet system of an MRI apparatus in accordance with at least two pulse sequence databases (PSDs) assumed to have the same echo time (TE) and different repetition times (TR); collection means for collecting MR signals at the time of driving the magnet system; image generation means for generating at least two MR images from the collected MR signals; and image weighting means for finding a difference between the two generated MR images and weighting a tissue having a specific T1 value from a found difference image.

Specifically, the image weighting means finds a difference image between the generated second and first images and weights a tissue having a large T1 value with reference to the found difference image. More specifically, the image weighting means weights a tissue having large T1 and T2 values with reference to the found difference image.

According to a fifth aspect of the present invention, there is provided an MRI apparatus, namely, an apparatus to implement the MRI method according to the second aspect of the present invention.

The MRI apparatus comprises: drive means for driving a magnet system of an MRI apparatus in accordance with two PSDs having the same repetition time (TR) and different echo times (TE); collection means for collecting MR signals at the time of driving the magnet system; image generation means for generating first and second MR images from the collected MR signals; and image weighting means for finding a difference between the generated second and first images and weighting a tissue having a specific T2 value from a found difference image.

According to a sixth aspect of the present invention, there is provided an MRI apparatus, namely, an apparatus to implement the MRI method according to the third aspect of the present invention. The MRI apparatus comprises: drive means for driving a magnet system of the MRI apparatus according to four pulse sequence databases (PSDs) shown below having different echo times (TE) and repetition times (TR), wherein (1) a fist PSD has echo time TE1 and repetition time TR1; (2) a second PSD has echo time TE1 and repetition time TR2; (3) a third PSD has echo time TE2 and repetition time TR1; and (4) a fourth PSD has echo time TE2 and repetition time TR2, where first echo time TE1<second echo time TE2 and first repetition time TR1<second repetition time TR2; collection means for collecting MR signals at the time of driving the magnet system; image generation means for generating first through fourth MR images from the collected MR signals; and image weighting means for finding an image difference between (third image−fourth image)−(first image−second image) and weighting a tissue having specific T1 and T2 values with reference to an obtained difference image.

Preferably, the image weighting means calculates the difference between images by using multiplication of an erasing coefficient for removing a specific tissue from one image.

The present invention provides a plurality of pulse sequence databases (PSDs) dependent on echo times TE and repetition times TR in the following combinations: (1) the same echo time and different repetition times; or (2) different echo times and the same repetition time; or (3) different echo times and different repetition times. Based on these PSDs, the present invention drives the magnet system, collects MR signals at that time, and obtains a weighted image for an intended tissue in accordance with the repetition time TR or the echo time TE in the prepared PSDs. Preferably, when finding the difference between images, one image is multiplied by a specific tissue, erasing coefficient to remove a specific tissue from the image.

For implementation of these PSDs containing the echo times and the repetition times, it is possible to use, for example, the spin echo (SE) technique, the fast spin echo (FSE) technique, the gradient echo technique, and the like.

According to the present invention, there is provided a plurality of different PSDs. The magnet system is driven based on the PSDs to collect MR signals at that time and find a difference between obtained images. An intended weighted image can be obtained in accordance with the repetition time TR or the echo time TE in the prepared PSDs. That is to say, the present invention can combine images having two or more contrasts with the same echo time TE and different repetition times TR, with different echo times TE and the same repetition time TR, or with different echo times TE and repetition times TR. In this manner, it is possible to weight only a tissue having specific T1 and T2 values.

When the specific T1 value is weighted, for example, the water and the fat can be simultaneously removed from the image. Since the present invention can adjust the specific T1 value, there is an advantage of simultaneously removing the water and the fat. Further, weighting the specific T2 value can select an intended tissue to be viewed. Since the present invention can also adjust the specific T2 value, users can select an intended tissue they want to view.

Moreover, it is possible to decrease the signal strength of the fat by composing (differentiating) an image having a sufficiently large TR and an image having a short TR.

Preferably, the composition of two or more images can use not only a simple difference, but also an appropriate coefficient multiplied by the subtraction for differentiation (composition). Such coefficient can be a ratio between two images to be composed or can be a fixed value.

The present invention can control the fat using nucleus data. Consequently, the fat can be controlled in a magnet system that has an uneven magnetic field or has a small magnetic field.

Likewise, the present invention provides an advantage of easily calculating the contrast compared to the TR of the FSE technique that controls the fat using nucleus data.

Unlike the conventional T1 and T2 computed imaging techniques, the present invention can provide the above-mentioned effects even if one pixel contains a plurality of tissues.

The present invention just needs to configure the PSD so as to realize the intended weighting without changing control means, data processing means, and the like in the MRI apparatus. Further objects and advantages of the present invention will be apparent from the following description of the preferred embodiments of the invention as illustrated in the accompanying drawings.

BRIEF DESCRIPTION OF THE DRAWINGS

FIG. 1 shows a configuration of the MRI apparatus as a first embodiment of the present invention;

FIGS. 5(A) through 5(E) show graphs exemplifying PSDs used for the FSE technique;

DETAILED DESCRIPTION OF THE INVENTION

Figure 2A:
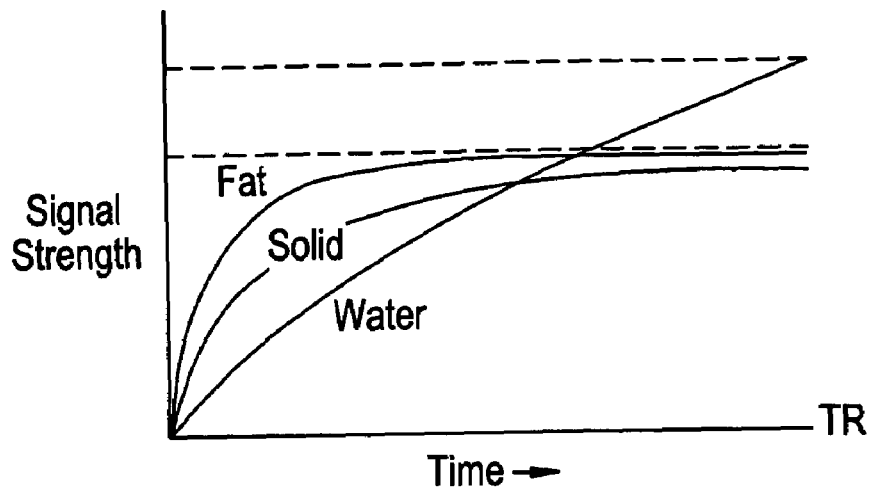
FIG. 2(A) shows a graph representing T1 recovery curves for major tissues.

The following describes the MRI apparatus according to the embodiment of the present invention and a signal processing method in the MRI apparatus.

[MRI Apparatus Configuration]

The following first describes a configuration example of the MRI apparatus according to the present invention.

FIG. 1 shows a configuration of the MRI apparatus as a first embodiment of the present invention. The MRI apparatus in FIG. 1 comprises a magnet system 100, a data collection section 150, an RF coil drive section 140, a gradient coil drive section 130, a control section 160, a data processing section 170, a display section 180, and an operation section 190.

The magnet system 100 comprises a main magnetic field coil 102, a gradient coil section 106, and an RF coil section 108. The magnet system 100 is installed in a scan room shielded against electromagnetic waves and the magnetism. The main magnetic field coil 102, the gradient coil section 106, and the RF coil section 108 are configured to be approximately cylindrical. A human body 300 as a subject is placed on a cradle 500. The human body 300 is moved into or out of an internal space (bore) of the magnet system 100 by transport means (not shown) together with the cradle 500 in accordance with regions subject to examination.

The main magnetic field coil 102 forms a magnetic field in the bore of the magnet system 100. The static magnetic field is directed approximately parallel to a body axis direction of the human body 300 as the subject to form a horizontal magnetic field. The embodiment exemplifies the main magnetic field coil 102 comprising a magnet such as a super conductive magnet.

Under control of the control section 160, the gradient coil drive section 130 drives a gradient coil 106 and applies a gradient (slope) to the static magnetic field strength formed in the magnet system 100. The gradient coil section 106 generates three types of gradient magnetic fields: a slice gradient magnetic field, a readout gradient magnetic field, and a phase encoding gradient magnetic field. The gradient coil section 106 has three types of gradient coils to generate these three types of gradient magnetic fields.

The RF coil section 108 has a transmission coil and a reception coil. Two special coils may be used for the transmission and reception coils. Alternatively, only one coil may be provided for both. For the convenience sake, the specification assumes that the RF coil section 108 includes both transmission and reception RF coils. Under control of the data processing section 170, the RF coil drive section 140 drives (excites) the transmission coil (transmission RF coil) of the RF coil section 108. In this manner, the RF coil drive section 140 forms a high frequency magnetic field for exciting a spin in the human body 300 as the subject. The reception coil (reception RF coil) detects a magnetic resonance (MR) signal as electromagnetic waves generated by the excited spin.

When conditioned to the steady state free precession (SSFP), for example, the reception RF coil section 108 (reception RF coil) detects an MR signal comprising a free induction decay (FID) signal, a spin echo (SE) signal, and a stimulated echo (STE) signal superimposed on each other.

Under control of the control section 160, the data collection section 150 is supplied with (collects) the MR signal detected by the reception RF coil and outputs the signal to the data processing section 170.

The data processing section 170 has a computer. The computer's memory stores various programs. According to these programs, the data processing section 170 cooperates with the control section 160 to collect MR signals, generate images from the collected MR signals, calculate a difference between the generated images, and apply various weighting operations to a difference image. These processes are performed based on a pulse sequence database (PSD) configured in accordance with a method to be described in detail. In addition, the data processing section 170 performs various operations associated with the MRI process. After the data collection section 150 collects MR signals, for example, the data processing section 170 stores these MR signals in the section's memory that specifies a data space of the two-dimensional Fourier space. Using MR signals stored in the memory, the data processing section 170 performs various signal processes including the perfusion imaging based on the maximum intensity projection (MIP) imaging, for example. The data processing section 170 uses the display section 180 to display a process result as the subject's MRI image.

The control section 160 cooperates with the data processing section 170 to control the gradient coil drive section 130, the RF coil drive section 140, and the data collection section 150 according to the configured PSD. In this manner, the control section 160 provides control to image a region subject to examination of the human body 300 as the subject. That is to say, according to the present invention, the control section 160 performs the following processes based on the configured PSD in cooperation with the data processing section 170. The embodiment assumes that an operator configures the PSD from the operation section 190 and that the PSD is stored in the memory of the control section 160 via the data processing section 170.

When a doctor, a technician, or the like (hereafter referred to as an operator) uses the MRI apparatus, he or she uses the operation section 190 to instruct intended operations and processes. The data processing section 170 and the control section 160 cooperatively process the contents instructed from the operation section 190. According to the embodiment, the operator uses the operation section 190 to configure the PSD in the memory of the control section 160.

Based on the PSD, the control section 160 activates (excites) various magnetic field generation coils in the magnet system 100 according to the PSD as follows.

[Outline of MRI Apparatus Operations]

To operate the MRI apparatus, the operator instructs intended MRI operations from the operation section 190. Prior to MRI operations, the operator specifies an intended PSD for the control section 160.

In accordance with instructions from the operation section 190, the data processing section 170 cooperates with the control section 160 based on the specified PSD to control the gradient coil drive section 130. In this manner, the data processing section 170 and the control section 160 generate a slice gradient magnetic field, a readout gradient magnetic field, a phase-encoded gradient magnetic field, and the like in the static magnetic field generated by the main magnetic field coil 102. Further, the data processing section 170 and the control section 160 excite the transmission coil via the RF coil drive section 140 in accordance with the instructions from the operation section 190. In this manner, a high-frequency magnetic field is formed in the static magnetic field space of the magnet system 100 so as to excite a spin in the human body 300 as the subject.

The data processing section 170 and the control section 160 drive transport means (not shown) in accordance with a region subject to examination of the human body 300 as the subject. Consequently, the cradle 500 moves into the bore of the magnet system 100.

For example, a doctor transvenously injects (infuses) an MR contrast agent such as a contrast agent of gadolinium (Gd) compound into the human body 300 as the subject. Gadolinium is not directly represented in an MR image but promotes the relaxation of hydrogen protons in the tissue. The presence of gadolinium is processed in the data processing section 170 and is indirectly represented as an MR image on the display section 180. When an MR signal is detected after injection of the contrast agent, the MR signal indirectly indicates the position and the density of the contrast agent.

The reception RF coil continuously detects MR signals (echo signals) as electromagnetic waves generated by the excited spin.

The data processing section 150 is continuously supplied with MR signals continuously detected by the reception RF coil and continuously outputs the signals to the data processing section 170.

The data processing section 170 operates various programs associated with the MRI process. These programs are stored in the memory of the computer constituting the data processing section 170. After the data collection section 150 collects MR signals, the data processing section 170 stores these MR signals in the memory of the data processing section 170. The memory specifies the data space for the two-dimensional Fourier space. Using the MR signals stored in the memory, the data processing section 170 displays perfusion images on the display section 180 according to a technique such as the maximum intensity projection (MIP) imaging, for example.

The following mainly describes processes in the control section 160.

The PSD prescribes the T1 and T2 weighting. Using the operation section 190, the operator specifies an intended PSD for the control section 160 or the data processing section 170 in advance. The control section 160 performs drive processes of the magnet system 100 based on the specified PSD.

[Basic MRI Contents Concerning the Present Invention]

Prior to detailed description of the MRI apparatus and the MRI method according to the present invention, the following first describes MRI technicalities concerning the present invention.

(1) TR signifies a repetition time. The repetition time TR indicates a time interval for generating RF pulses used to obtain a resonance signal and determines the amount of longitudinal relaxation (T1 relaxation, spin-lattice relaxation).

(2) TE signifies an echo (delay) time (hereafter referred to as an echo time). The echo time TE indicates a time period after the first RF pulse is output to excite the spin until an echo signal is obtained. The echo time TE determines the degree of spin dispersion for the transverse magnetization (transverse relaxation, T2 relaxation, spin-spin relaxation).

(3) T1 signifies a longitudinal relaxation time (or spin-lattice relaxation time).

(4) T2 signifies a transverse relaxation time (or spin-spin relaxation time).

(5) T2* signifies a time constant of exponential function representing a free induction decay (FID) signal for the gradient echo technique ($e^{-t/T2^*}$).

The longitudinal relaxation time T1 and the transverse relaxation time T2 are characteristics specific to tissues. Each tissue has predetermined T1 and T2. The following exemplifies T1 and T2 for typical tissues.

TABLE 1

| Tissue | T1 (ms) | T2 (ms) |
| --- | --- | --- |
| Water | 2500 | 2500 |
| Fat | 200 | 100 |
| CSF | 2000 | 300 |
| Protein | 500 | 100 |

[Transverse Relaxation Time T2]

The tissue's transverse relaxation time T2 is characterized by a phase dispersion speed of hydrogen atomic nucleus spin in the tissue. A fast phase dispersion decreases T2. A slow phase dispersion increases T2. Since the water molecule has the structure of H—O—H and is dilute, there is a very small spin-spin interaction between hydrogen protons. Compared to the other tissues, the phase dispersion of water progresses very slowly. Therefore, the water's T2 relaxation time is long. The molecular structure of a solid matter contrasts with the pure water and is very dense. An interaction between hydrogen protons frequently occurs. The solid's T2 time is short because the phase dispersion fast progresses due to many spin-spin interactions. With respect to structures of fat and protein substances, the phase dispersion is slower than that of the solid and is faster than that of the water. The T2 time for the fat and the protein substance is situated at the middle of the water and the solid.

[Longitudinal Relaxation Time T1]

The longitudinal relaxation time T1 for the tissue depends on whether or not the hydrogen atomic nucleus in the tissue can exchange energy with surrounding lattices. It is known that the most efficient energy provision occurs when the free movement of protons matches the Larmor frequency. In other words, a precession frequency of hydrogen proton becomes 42.6 MHz in a 1-tesla magnetic field. However, the free movement frequency depends on physical states of the tissue and is greatly affected by a coupled atom or a nearby atom.

A hydrogen proton in the small water molecule maintains a relatively high natural frequency compared to a hydrogen proton in the solid, for example. The natural movement frequency of a hydrogen proton in the water is much higher than the hydrogen's Larmor frequency. Therefore, the water has a long T1 time.

The natural movement frequency of the hydrogen proton is lower in the solid than in the water. The natural movement frequency of the hydrogen proton in the solid is slightly lower than the hydrogen's Larmor frequency. Therefore, the solid's T1 time is slightly shorter than the water's T1 time.

The hydrogen proton of the fat has almost the same natural movement frequency as the Larmor frequency used for the MRI. The carbon's revolving movement frequency around the terminal carbon-carbon bond in the fat approximates to the Larmor frequency. This results from an increase of energy exchange between the proton and the lattice, thus shortening the T1 time.

The T1 time for the protein substance is situated at the middle of the solid and the water.

Figure 2B:
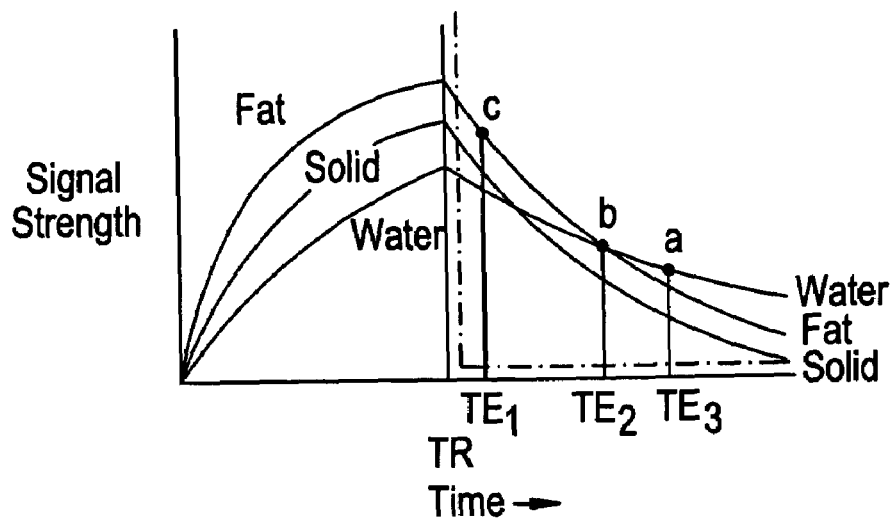
FIG. 2(B) shows a graph representing T2 decay curves for major tissues.

FIG. 2(A) shows a T1 recovery curve for the fat, water, and solid. FIG. 2(B) shows a T2 decay curve for the fat, water, and solid. According to FIGS. 2(A) and 2(B), it is clear that the fat has the shortest T1 time and shows the steepest T1 recovery curve. Likewise, it is clear that the protein liquid shows a short T1 time. It is clear that the water has the longest T1 time and shows the most gentle T1 recovery curve. It is clear that the solid has the intermediate T1 time.

As mentioned above, the longitudinal relaxation time T1 depends on the repetition time TR. A long TR decreases the effect of T1. A short TR increases the effect of T1, i.e., intensifies the contrast. On the other hand, the transverse relaxation time T2 depends on the echo (delay) time TE. A short TE decreases the effect of T2 (T2*). A long TE increases the effect of T2 (T2*), i.e., intensifies the contrast. A T1 weighted image and a T2 weighted image each are obtained by weighting specific tissues.

A T1 weighted image is obtained at a short repetition time TR in the spin echo (SE) technique, for example. The use of T1 weighting in the SE technique can image a tissue having a larger T1 value at a high intensity by specifying a short TE (e.g., several milliseconds) and a short TR (e.g., 300 to 500 ms).

Figure 3:
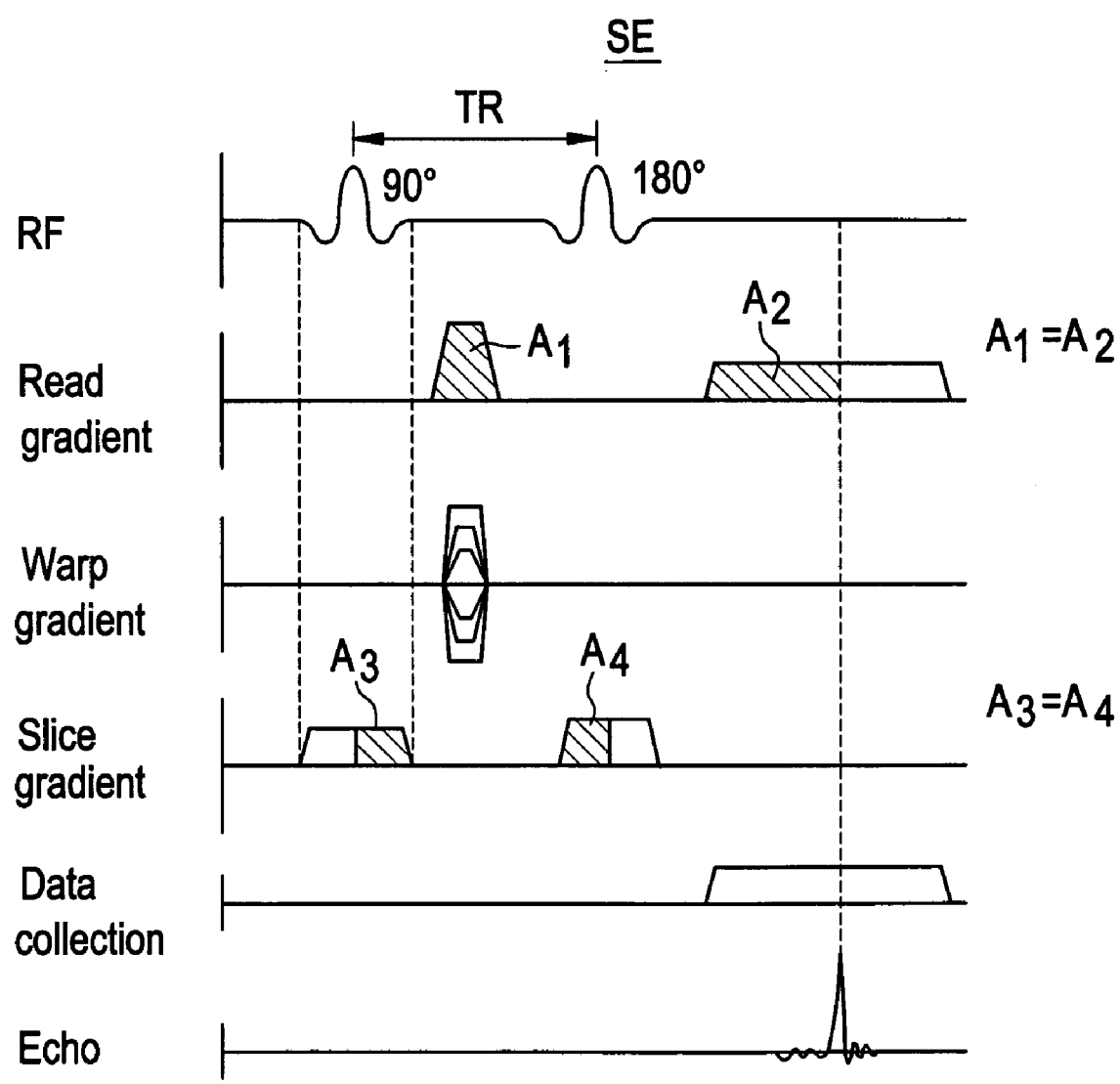
FIG. 3 shows graphs illustrating the SE technique.

FIG. 3 illustrates an example of the SE technique.

The T2-weighted image is imaged by the spin echo (SE) technique or the fast spin echo (FSE) technique using a long repetition time TR. Since an echo signal to be generated follows the T2 decay in this case, an image to be created is referred to as the T2-weighted image. When the SE technique is used to obtain a T2-weighted image, the next RF pulse is applied after the longitudinal magnetization is fully recovered. Consequently, the repetition time TR becomes long. A long repetition time TR causes a problem of requiring a very long imaging time. To solve this problem, the FSE technique is used.

Figure 4:
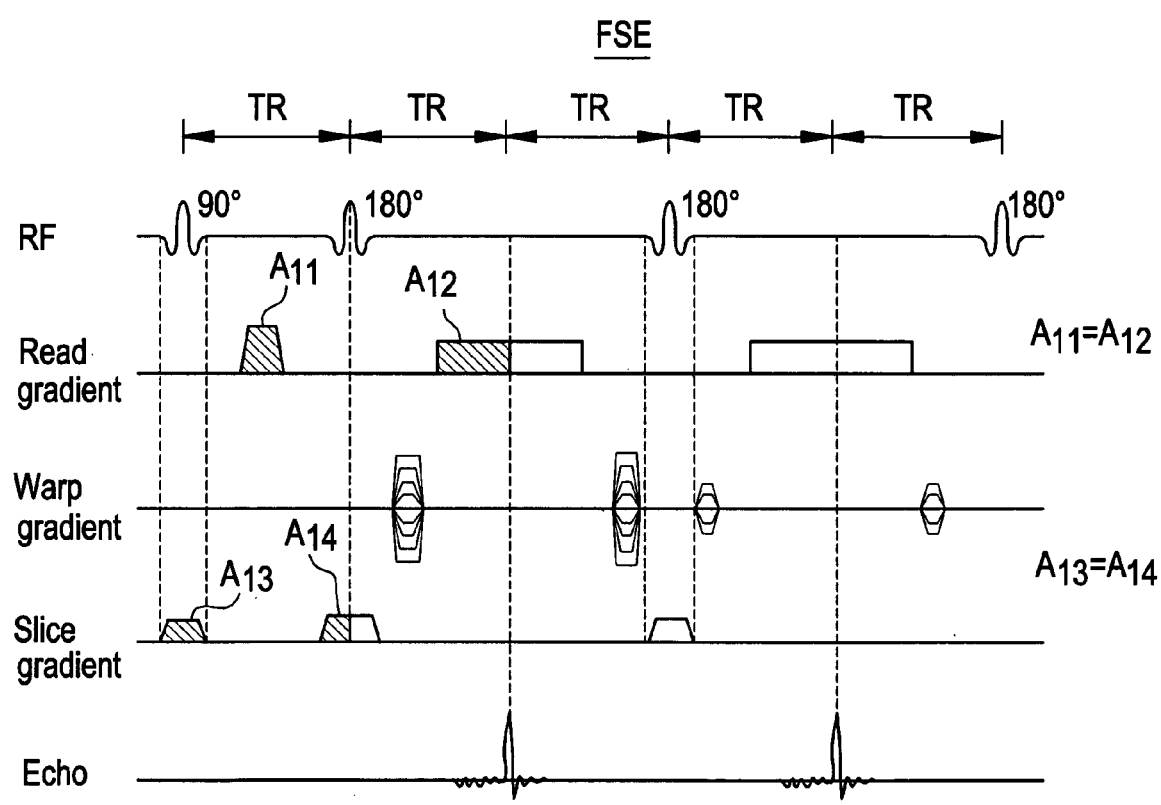
FIG. 4 shows graphs illustrating the FSE technique.

FIG. 4 illustrates an example of the FSE technique. The FSE technique generates many spin echoes by using one 90° excitation pulse and a plurality of 180° successive convergence pulses. These pulses are independently used as phase encoding signal to drastically accelerate the imaging. The use of T2 weighting in the FSE technique can image a tissue having a larger T2 value at a high intensity by specifying a long TE (e.g., 100 to 200 ms) and a long TR (e.g., 2000 to 5000 ms). The use of proton density weighting in the FSE technique can image a tissue having a higher hydrogen density at a high intensity by specifying a short TE (e.g., several milliseconds) and a long TR (e.g., 2000 to 5000 ms).

The gradient echo (GRE) technique causes relaxation according to a T2* decay such as the free induction decay (FID). An image obtained by such technique is referred to as the T2*-weighted image. The use of T2* weighting in the GRE technique can image a tissue having a larger T2 value at a high intensity by specifying a long TE (e.g., 20 ms) and a long TR (e.g., several hundred milliseconds) for the GRE technique.

The use of T2/T1 weighting in the steady state free precession (SSFP) mode can image a tissue having a high ratio of T2/T1 at a high intensity by specifying a short TE (e.g., several milliseconds) and a short TR (e.g., 10 ms) both for the gradient echo (GRE) technique.

[Examples of PSD]

The PSD determines the repetition time TR. In other words, an MRI apparatus operator specifies a PSD based on the above-mentioned knowledge and intended weighting.

FIGS. 5(A) through 5(E) exemplify specific PSDs in the SSFP mode. These PSDs are specified for the control section 160 as shown in FIG. 1 through the use of the operation section 190.

FIG. 5(A) is a waveform diagram representing the frequency for an excitation signal applied to the transmission RF coil. The continuous RF signal is based on an interval of 1 TR (cycle) and is applied to the transmission RF coil at the interval of repetition time TR under control of the control section 160. As mentioned above, the gradient coil drive section 130 drives the gradient coil section 106 under control of the control section 160 to apply a gradient (slope) to the static magnetic field strength formed in the magnet system 100. The gradient coil section 106 generates three types of gradient magnetic fields: a slice gradient magnetic field, a readout gradient magnetic field, and a phase encoding gradient magnetic field. The gradient coil section 106 has three types of gradient coils to generate these three types of gradient magnetic fields.

FIG. 5(B) is a waveform diagram representing a slice pulse to generate the slice gradient magnetic field.

FIG. 5(C) is a waveform diagram representing a read pulse to generate the readout gradient magnetic field.

FIG. 5(D) is a waveform diagram representing a warp pulse to generate the phase encoding gradient magnetic field. As indicated by the solid line, the warp pulse forms a waveform that allows the vertical signal integration to cause 0 with reference to a center warp pulse WW0 during one TR (cycle). For example, the first warp pulse WP1 forms a vertically symmetric waveform. The same applies to the second warp pulse WP2 and the third warp pulse WP3.

FIG. 5(E) is a waveform diagram representing an echo signal detected as the MR signal by the reception RF coil. The data processing section 170 accepts the MR signal from the reception RF coil, generates an MRI image of the subject, and displays it on the display section 180.

[Examples of the Weighting Process According to the Present Invention]

For example, the present invention uses the PSD for the spin echo (SE) technique as shown in FIG. 3; and the PSD for the fast spin echo (FSE) technique, the PSD for the gradient echo (GRE) technique, and the PSD for the steady state free precession (SSFP) technique as shown in FIGS. 4 and 5.

[First Embodiment T1 Weighting]

The following describes the T1 weighting as the first embodiment of the weighting process according to the present invention.

For example, equation 1 to follow gives the signal strength S of the MR signal in the SE technique or the FSE technique.

[Equation 1]

$$S = \rho\{1-\exp(-TR/T1)\}\exp(-TE/T2) \quad (1)$$

where $\rho$ is the hydrogen density.

Therefore, the following signal strengths S1 and S2 are applied to the MR signals (echo signals) used for the image generation assuming that the echo time TE is the same and the repetition time TR differs, i.e., the first and second repetition times TR1 and TR2, where TR1<TR2.

[Equation 2]

$$S1 = \rho\{1-\exp(TR1/T1)\}\exp(-TE/T2)$$

$$S2 = \rho\{1-\exp(TR2/T1)\}\exp(-TE/T2) \quad (2)$$

Equation 3 to follow gives a difference between the signal strengths S1 and S2 (S1~S2) for two MR signals in the SE or FSE technique. The difference is represented as (S2−S1) as an example.

[Equation 3]

$$S1-S2 = \{\exp(-TR1/T1)-\exp(-TR2/T1)\}\exp(-TE/T2) \quad (3)$$

When equation 3 for a difference between the signal strengths is differentiated using the T1 value to find the local maximum of the T1 value. The local maximum is represented by equation 4 as follows.

[Equation 4]

$$T1\max = (TR2-TR1)/\ln(TR2/TR1) \quad (4)$$

Figure 6A:
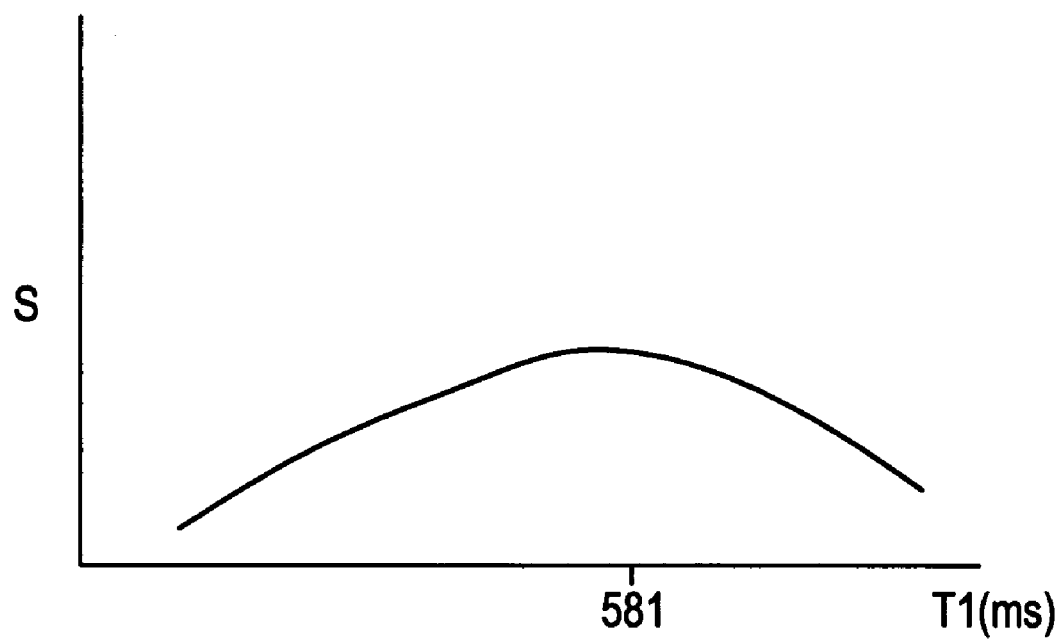
FIG. 6(A) is a graph illustrating the T1 weighting.

For example, assuming TR1=300 ms and TR2=1000 ms in equation 4, the tissue of T1=581 ms is most weighted as shown in FIG. 6(A). The other tissues show decreased signal strengths as T1 departs from 581 ms. Therefore, the tissue of T1=581 ms can provide the most weighted image.

Figure 7:
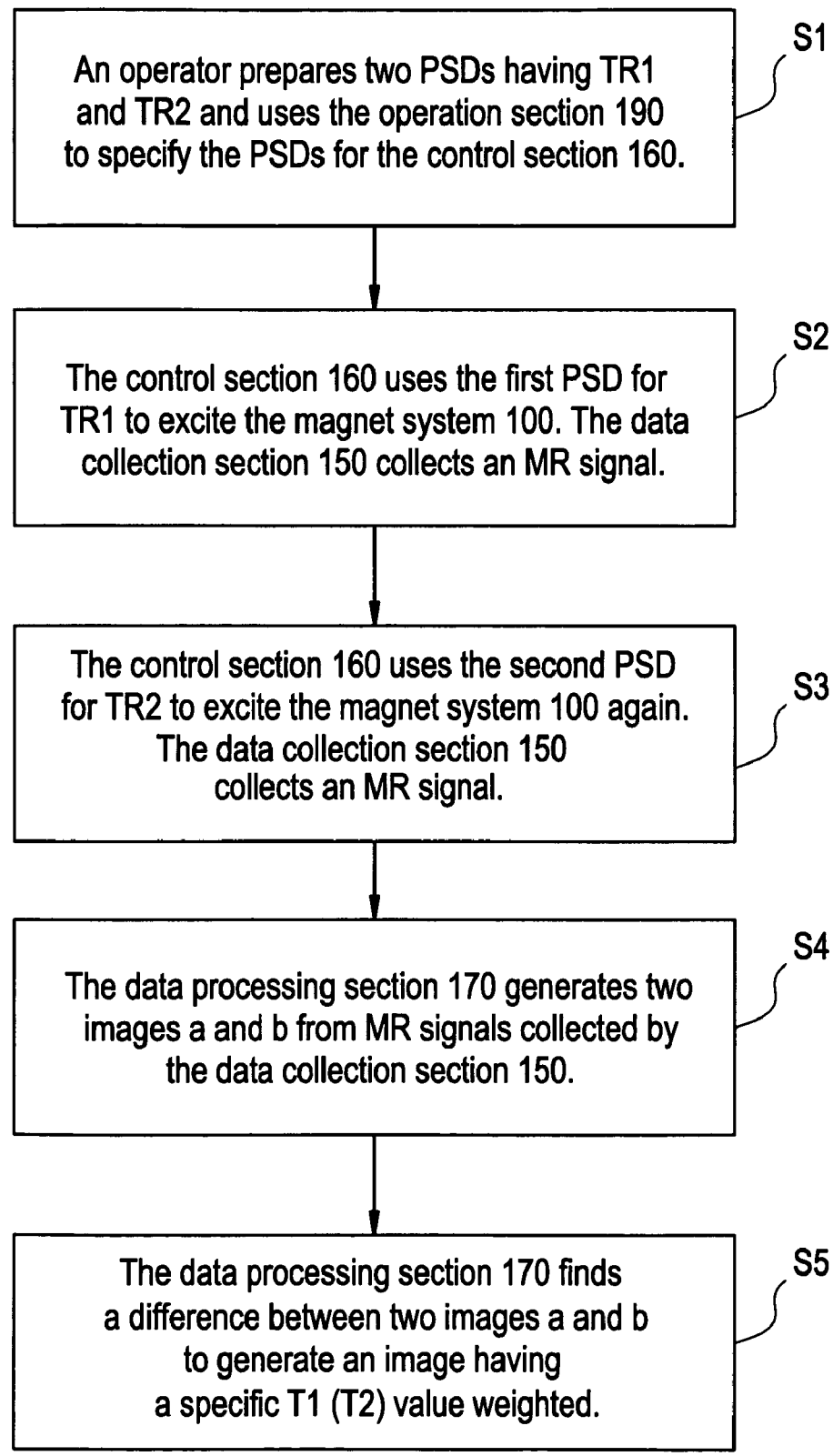
FIG. 7 is a first flowchart showing the control process performed by the MRI apparatus according to the first embodiment of the present invention.

The MRI apparatus according to the first embodiment of the present invention performs the following process as shown in the flowchart of FIG. 7.

(1) Step 1

An operator prepares the following two PSDs having the same echo time TE and a repetition time TR1 and a second repetition time TR2 different from each other. The operator uses the operation section 190 to specify the two PSDs for the control section 160. The operation section 190 is equivalent to means for preparing the PSD according to the present invention.

(a) First-image PSD (TE,TR)=(TE,TR1),
(b) Second-image PSD (TE,TR)=(TE,TR2), where first repetition time TR1<second repetition time TR2.

The first-image PSD (TE,TR)=(TE,TR1) represents the echo time and the first repetition time in the first-image PSD used for imaging a first image. The second-image PSD (TE,TR)=(TE,TR2) represents the echo time and the second repetition time in the second-image PSD used for imaging a second image. Implementation of these PSDs can use, for example, the spin echo (SE) technique, the fast spin echo (FSE) technique, the gradient echo technique, and the SSFP technique.

(2) Step 2

The control section 160 uses the first PSD for the first repetition time TR1 to excite the magnet system 100. The data collection section 150 collects an MR signal. The control section 160 is equivalent to means for driving the magnet system according to the present invention. The data collection section 150 is equivalent to data collection means according to the present invention.

(3) Step 3

The control section 160 uses the second PSD for the second repetition time TR2 to excite the magnet system 100 again. The data collection section 150 collects an MR signal.

(4) Step 4

The data processing section 170 generates two images a and b from two MR signals collected by the data collection section 150. The data processing section 170 is equivalent to image generation means according to the present invention.

(5) Step 5

The data processing section 170 finds a difference between two images a and b and uses the found difference image to generate an image that weights a tissue having a specific T1 value. The result is displayed on the operation section 190, for example. The data processing section 170 is equivalent to weighted image generation means according to the present invention.

[Second Embodiment T2 Weighting]

The following describes the T2 weighting as the second embodiment of the weighting process according to the present invention.

A specific T2 value can be weighted in the manner similar to that for the first embodiment. In a case of executing two PSDs having the same repetition time TR and different echo times TE, i.e., different first and second echo times TE1 and TE2, where TE1<TE2, the different echo times TE1 and TE2 correspond to signal strengths Sa and Sb expressed by equation 5 below.

[Equation 5]

$$Sa = \rho\{1-\exp(-TR/T1)\}\exp(-TE1/T2)$$

$$Sb = \rho\{1-\exp(-TR/T1)\}\exp(-TE2/T2) \quad (5)$$

Equation 6 to follow gives a difference between the signal strengths Sa and Sb (Sa~Sb) for two MR signals. The difference is represented as (Sa−Sb) as an example (therefore, TE1<TE2).

[Equation 6]

$$Sa-Sb = \mu(1-\exp(-TR/T1))$$

$$\times(\exp(-TE1/T2)-\exp(-TE2/T2)) \quad (6)$$

When equation 6 is differentiated using the T2 value to find the local maximum of the T2 value, the local maximum is represented by equation 7 as follows.

[Equation 7]

$$T2 = (TE2-TE1)/\ln(TE2/TE1) \quad (7)$$

Figure 6B:
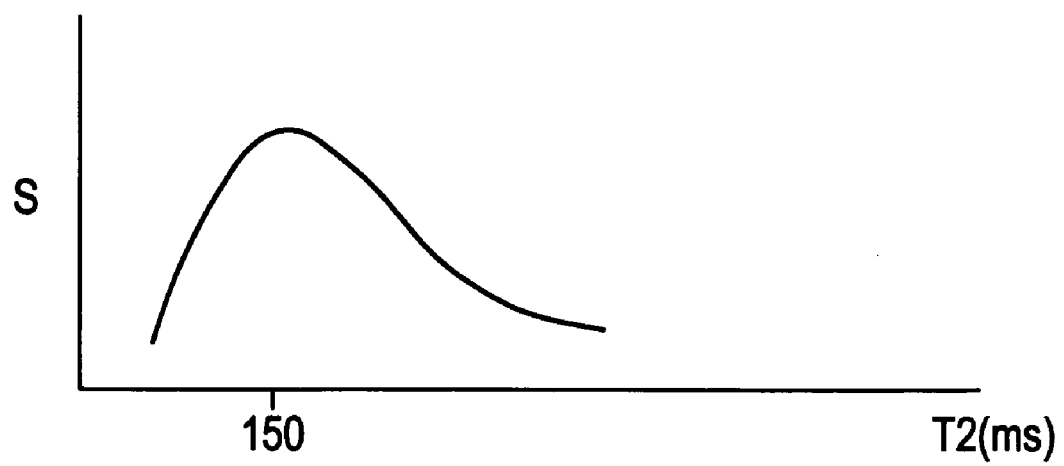
FIG. 6(B) is a graph illustrating the T2 weighting.

For example, assuming TE=50 ms and TE1=300 ms in equation 7, the tissue of T2=150 ms is most weighted as shown in FIG. 6(B). The other tissues show decreased signal strengths as T2 departs from 150 ms. Therefore, the tissue of T2=150 ms can provide the most weighted image.

[Third Embodiment General Weighting]

The third embodiment of the weighting process according to the present invention preferably uses two contrasts to generate an image that weights a tissue only having specific T1 and T2 values. The third embodiment uses the PSD for the SE technique or the FSE technique, for example. The third embodiment measures images having different TR and TE more than once to generate images having specific contrasts. These images are then combined to weight only tissues having specific T1 and T2 values. For example, the contrast for the SE technique is generally expressed by the following equation.

[Equation 8] (8)

$$\sum_n \rho_n(1-\exp(-TRm/T1n))\exp(-TEm/T2n) + NZ$$

where n represents the type of tissue present in one pixel, m the numbers assigned to a plurality of images having different TR and TE, and NZ the noise.

This technique is not limited to n=1 and does not have to use one type of tissue present in one pixel. The calculation is subject to no problems if a plurality of tissues are intermingled in one pixel. In this respect, the present invention is superior to the prior art.

The third embodiment will be described with reference to FIG. 8.

Figure 8:
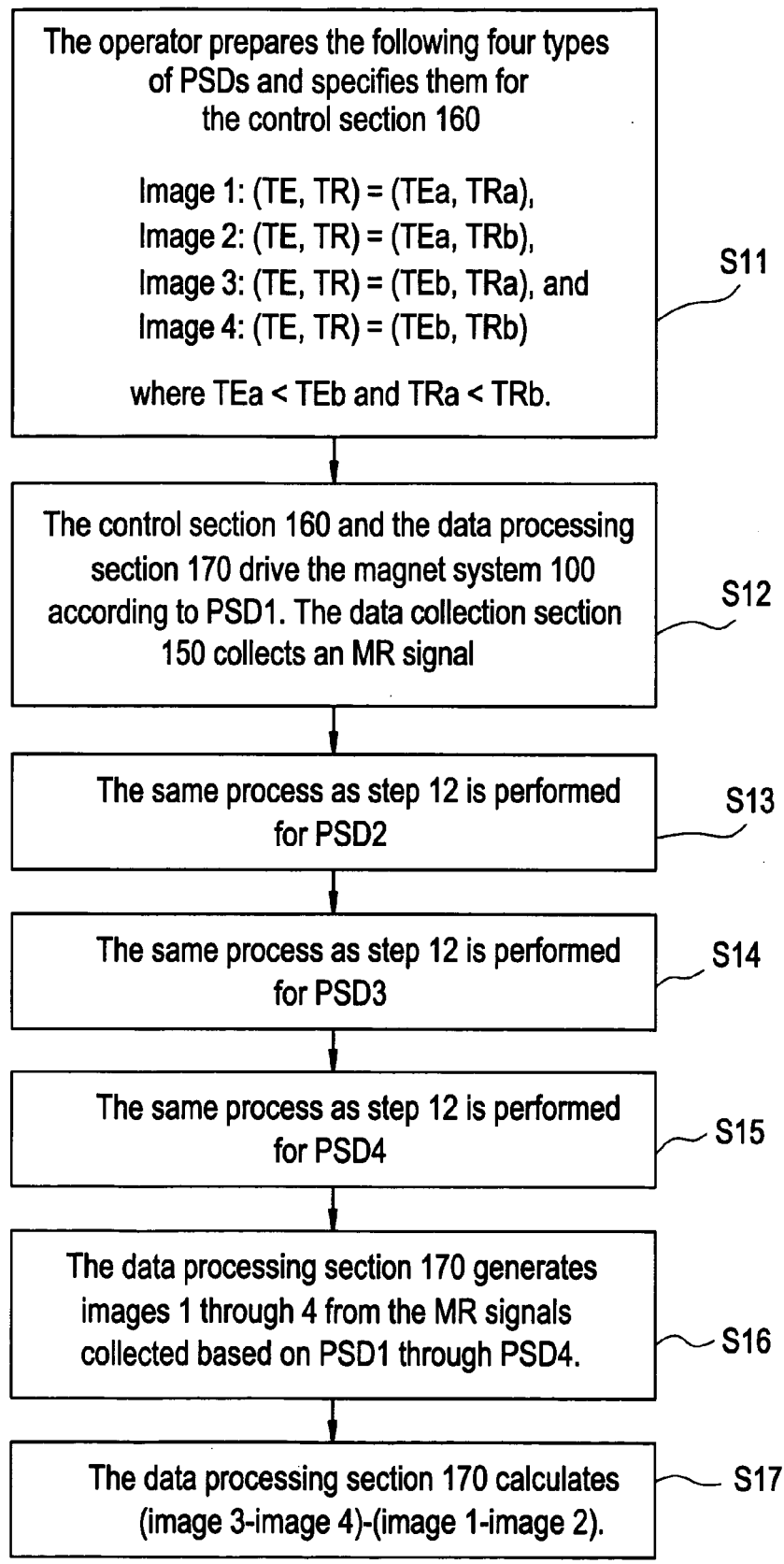
FIG. 8 is a second flowchart showing the control process performed by the MRI apparatus according to the second embodiment of the present invention.

Step 11 in FIG. 8: The operator prepares the following four types of PSDs and specifies them for the control section 160.

(1) First-image PSD1 (TE,TR)=(TE1,TR1),
(2) Second-image PSD2 (TE,TR)=(TE1,TR2),
(3) Third-image PSD3 (TE,TR)=(TE2,TR1), and
(4) Fourth-image PSD4 (TE,TR)=(TE2,TR2)

where TE1<TE2 and TR1<TR2.

Steps 12 through 15: The control section 160 and the data processing section 170 sequentially process the first PSD1 through the fourth PSD4. For example, the control section 160 excites (drives) the magnet system 100 based on PSD1. The data processing section 170 collects an MR signal as the result. This process is repeated for PSD2 through PSD4.

Step 16: The data processing section 170 generates images 1 through 4 from the MR signals collected based on PSD1 through PSD4.

Step 17: The data processing section 170 calculates (image 3−image 4)−(image 1−image 2). As a result, the following contrast is obtained.

[Equation 9]

$$Sn = \sum_n \rho_n \{\exp(TR1/T1n) - \exp(-TR1/T1n) \times \exp(-TE2/T2n) - \exp(-TE2/T2n)\} + NZ \quad (9)$$

Partially differentiating equation 9 with T1 and T2 yields local maximums for T1 and T2. The signal strength decreases as T1 or T2 departs from the corresponding local maximum. As a result, it is possible to weight tissues having the T1 and T2 values.

[Fourth Embodiment]

The fourth embodiment according to the present invention provides a method of removing a signal (image) for a specific tissue such as fat. A signal for the fat can be suppressed by finding a difference between an image acquired from the PSD using a sufficiently long TR and an image acquired from another PSD using a short TR. To weight a specific T1 value, a difference between images for different repetition times TR1 and TR2 gives a contrast expressed by the following equation.

[Equation 10]

$$\Sigma \rho_n \{\exp(-TR1/T1n) - \exp(-TR2/T1n)\} \times \exp(-TE/T2n) + NZ \quad (10)$$

When TR2 is sufficiently long such as TRb ranging from 2000 to 4000 ms, exp(−TR2/T1n) becomes almost 0, allowing the approximation by equation 11 below.

[Equation 11]

$$\Sigma \rho_n (\exp(-TR1/T1n)) \exp(-TE/T2n) + NZ \quad (11)$$

From equation 11, it is clear that a tissue having long T1 and T2 can be weighted. Since the fat exhibits approximately T1=200 ms and T2=100 ms, the signal strength tends to decrease. By contrast, it is possible to weight tissues such as tumors, blood vessels, and cerebrospinal fluids having longer T1 and T2, e.g., T1>1000 ms and T2>100 ms.

[Fifth Embodiment]

While the above-mentioned embodiment uses a simple subtraction to find a difference between two images, some coefficient may be used for multiplication in the subtraction. For example, the following equation uses coefficient a.

[Equation 12]

$$\Sigma \rho_n \{\exp(-TR1/T1n) - a \times \exp(-TR2/T1n)\} \exp(-TE/T2n) + NZ \quad (12)$$

Coefficient a may be fixed. To remove a specific tissue such as fat, for example, fat erasing coefficient a needs to be optimized for satisfying a=exp(−TR1/T1f)/exp(−TR2/T1f), where T1f represents the T1 value for fat. In this manner, fat images can be removed efficiently. The operator may adjust the fat erasing coefficient a. While the above-mentioned example has described removal of the fat, images for the other tissues can be removed. In such case, the operator will use an erasing coefficient suited to remove the specific tissue.

[Other Embodiments]

While there have been described specific embodiments using the SE technique, the FSE technique, and the like, embodiments of the present invention are not limited thereto. It is possible to obtain results similar to the above-mentioned embodiments according to the present invention when composing images of different contrasts according to the GRASS, spoiled GRASS, and SSFP techniques.

Many widely different embodiments of the invention may be configured without departing from the spirit and the scope of the present invention. It should be understood that the present invention is not limited to the specific embodiments described in the specification, except as defined in the appended claims.

The invention claimed is:

1. An MRI method comprising the steps of:
   preparing at least two pulse sequence databases (PSDs) assumed to have the same echo time (TE) and different repetition times (TR), wherein the PSDs include a first PSD and a second PSD;
   driving a magnet system of an MRI apparatus in accordance with said two PSDs and collecting MR signals at that time;
   generating a first MR image from a portion of the MR signals collected in accordance with said first PSD;
   generating a second MR image from a portion of the MR signals generated by executing the second PSD;
   calculating a difference between the first and second MR images; and
   weighting a tissue having a specific T1 value with reference to an image corresponding to the difference between two MR images.

2. The MRI method according to claim 1 further comprising the step of:
   weighting a tissue having a large T1 value with reference to said difference image.

3. The MRI method according to claim 1 further comprising the step of:
   weighting a tissue having large T1 and T2 values with reference to said difference image.

4. The MRI method according to claim 1,
   wherein a calculation to find said difference between images uses multiplication of an erasing coefficient for removing a specific tissue from one image.

5. An MRI apparatus comprising:
   a drive device configured to drive a magnet system of an MRI apparatus in accordance with at least two pulse sequence databases (PSDs) assumed to have the same echo time (TE) and different repetition times (TR), wherein the PSDs include a first PSD and a second PSD;
   a collection device configured to collect MR signals at the time of driving said magnet system;
   an image generation device configured to generate a first MR image from a portion of said collected MR signals generated from the first PSD, wherein said image generation device configured to generate a second MR image from a portion of the collected MR signals generated from the second PSD; and
   an image weighting device configured to find a difference image between the first and second MR images and configured to weigh a tissue having a specific T1 value from the difference image.

6. The MRI apparatus according to claim 5,
   wherein said image weighting device weights a tissue having a large T1 value with reference to said difference image.

7. The MRI apparatus according to claim 6,
   wherein said image weighting device weights a tissue having large T1 and T2 values with reference to said difference image.

8. An MRI apparatus comprising:

a drive device configured to drive a magnet system of an MRI apparatus according to four pulse sequence databases (PSDs) shown below in combination with first and second echo times (TE) and first and second repetition times (TR), wherein (1) a first PSD has echo time TE1 and repetition time TR1;
(2) a second PSD has echo time TE1 and repetition time TR2;
(3) a third PSD has echo time TE2 and repetition time TR1; and
(4) a fourth PSD has echo time TE2 and repetition time TR2, where first echo time TE1<second echo time TE2 and first repetition time TR1<second repetition time TR2;

a collection device configured to collect MR signals at the time of driving said magnet system;

an image generation device configured to generate a first, a second, a third, and a fourth MR image from said collected MR signals; and an image weighting device configured to find a first difference between the first and second MR images, a second difference between the third and fourth MR images, and an image difference between the second difference and the first difference, wherein said image weighting device configured to weigh a tissue having specific T1 and T2 values with reference to the image difference.

9. The MRI apparatus according to claim 5, wherein said image weighting device calculates said difference between images by using multiplication of an erasing coefficient for removing a specific tissue from one image.

10. The MRI apparatus according to claim 8, wherein said image weighting device calculates said difference between images by using multiplication of an erasing coefficient for removing a specific tissue from one image.

\* \* \* \* \*